United States Patent
Song et al.

(10) Patent No.: US 10,461,492 B2
(45) Date of Patent: Oct. 29, 2019

(54) METHOD FOR SYNTHESIS OF GRAPHENE ALONG WAVEGUIDES IN SITU, PHOTONICS DEVICE INCLUDING GRAPHENE OBTAINED USING THE METHOD

(71) Applicant: KOREA INSTITUTE OF SCIENCE AND TECHNOLOGY, Seoul (KR)

(72) Inventors: Yong-Won Song, Seoul (KR); Pulak Chandra Debnath, Seoul (KR); Md. Siam Uddin, Seoul (KR)

(73) Assignee: KOREA INSTITUTE OF SCIENCE AND TECHNOLOGY, Seongbuk-Gu, Seoul (KR)

(*) Notice: Subject to any disclaimer, the term of this patent is extended or adjusted under 35 U.S.C. 154(b) by 0 days.

(21) Appl. No.: 15/871,065

(22) Filed: Jan. 15, 2018

(65) Prior Publication Data
US 2019/0027889 A1    Jan. 24, 2019

(30) Foreign Application Priority Data

Jul. 20, 2017    (KR) .......................... 10-2017-0091984

(51) Int. Cl.
*H01S 3/11* (2006.01)
*H01S 3/08* (2006.01)
(Continued)

(52) U.S. Cl.
CPC .......... *H01S 3/1115* (2013.01); *C30B 25/105* (2013.01); *C30B 29/02* (2013.01);
(Continued)

(58) Field of Classification Search
CPC .... H01S 3/1115; H01S 3/08013; H01S 3/083; H01S 3/08054; C30B 29/02;
(Continued)

(56) References Cited

U.S. PATENT DOCUMENTS

| 8,139,617 B2 | 3/2012 | Song |
| 2018/0002831 A1 | 1/2018 | Wang et al. |

FOREIGN PATENT DOCUMENTS

| JP | 2017507886 A | 3/2017 |
| JP | 2017512181 A | 5/2017 |

(Continued)

OTHER PUBLICATIONS

Debnath, et al., In Situ Synthesis of Graphene with Telecommunication Lasers for Nonlinear Optical Devices, Adv. Optical Mater. 2015; 3: 1264-1272 (Year: 2015).*

(Continued)

*Primary Examiner* — Daniel C. McCracken
(74) *Attorney, Agent, or Firm* — Cantor Colburn LLP

(57) ABSTRACT

A method for in situ synthesis of graphene along a lengthwise direction of a waveguide applied to a photonic device includes processing an evanescent field of laser propagating in the waveguide to spread outward the waveguide, depositing a nickel thin film on a surface of the waveguide, growing graphene between a surface of the waveguide and a nickel thin film by irradiating telecommunication laser to a core of the waveguide, and removing the nickel thin film from the waveguide. Accordingly, graphene with high optical nonlinearity is in situ synthesized in the photonic device.

11 Claims, 20 Drawing Sheets

(51) Int. Cl.
*C30B 29/02* (2006.01)
*H01S 3/083* (2006.01)
*H01S 3/00* (2006.01)
*C30B 25/10* (2006.01)
*G02F 1/01* (2006.01)
*G02F 1/35* (2006.01)
*H01S 3/23* (2006.01)

(52) U.S. Cl.
CPC .......... *G02F 1/0118* (2013.01); *G02F 1/3536* (2013.01); *H01S 3/0092* (2013.01); *H01S 3/083* (2013.01); *H01S 3/08013* (2013.01); *H01S 3/08054* (2013.01); *H01S 3/0078* (2013.01); *H01S 3/2391* (2013.01)

(58) Field of Classification Search
CPC ............ C01B 2204/00; C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32
USPC ............................ 204/157.4, 157.41, 157.47
See application file for complete search history.

(56) References Cited

FOREIGN PATENT DOCUMENTS

| KR | 101028803 B1 | 4/2011 |
| KR | 1020140003218 A | 1/2014 |
| KR | 101502390 B1 | 3/2015 |
| KR | 1020160094247 A | 8/2016 |
| WO | 2015119572 A1 | 8/2015 |

OTHER PUBLICATIONS

Christopher T. Phare et al., "Graphene electro-optic modulator with 30 GHz bandwidth," Nature Photonics, Aug. 2015, pp. 511-515, vol. 9, Macmillan Publishers Limited.

Eun Jung Lee et al., "Active control of all-fibre graphene devices with electrical gating," Nature Communications, Apr. 21, 2015, pp. 1-6, vol. 6, Art. 6851, Macmillan Publishers Limited.

Ming Liu et al., "A graphene-based broadband optical modulator," Nature, 2011, pp. 64-67, vol. 474, Macmillan Publishers Limited.

Pulak C. Debnath et al., "In Situ Synthesis of Graphene with Telecommunication Lasers for Nonlinear Optical Devices," Advanced Optical Materials, 2015, pp. 1264-1272, vol. 3, No. 1164.

* cited by examiner

METHOD FOR SYNTHESIS OF GRAPHENE ALONG WAVEGUIDES IN SITU, PHOTONICS DEVICE INCLUDING GRAPHENE OBTAINED USING THE METHOD

CROSS-REFERENCE TO RELATED APPLICATION

This application claims priority to Korean Patent Application No. 10-2017-0091984, filed on Jul. 20, 2017, and all the benefits accruing therefrom under 35 U.S.C. § 119, the contents of which in its entirety are herein incorporated by reference.

BACKGROUND

1. Field

The present disclosure relates to a method for in situ synthesis of graphene along the lengthwise direction of waveguide and a photonic device including graphene obtained using the method, and more particularly, to technology that synthesizes graphene in situ at a desired part in a photonic device, in particular, a lengthwise direction side surface of an optical waveguide using telecommunication laser, and based on this, implements an optical nonlinear device such as femtosecond pulse laser and an ultrafast optical switch.

DESCRIPTION OF GOVERNMENT-SPONSORED RESEARCH AND DEVELOPMENT

This research is done in support of Bio, medical technology development (Development of voltage type diabetes diagnostic device, Project series number: 1711054979) of Ministry of Science, ICT and Future Planning under the supervision of Korea Institute of Science and Technology.

2. Description of the Related Art

Generally, in the case of photonic devices that operate at ultra-high speed, oxide crystals and semiconductors having excellent optical nonlinear properties have been used. However, their large volume made it difficult to respond to the evolution of photonic devices requiring integration, and to solve the problem, studies and optical applications of nanomaterials having optical nonlinearity are recently on the increase.

Among nanomaterials, a typical material is definitely carbon nanomaterials. Among them, graphene has been the center of attention due to being easy to synthesize or exfoliate, and because of its excellent operating characteristics, studies are being continuously and intensively conducted. Generally, to apply graphene to photonic devices, a transfer process is used. Transfer refers to a process of moving graphene grown on a particular substrate to a surface of a target photonic device, and in this process, the structure of graphene is damaged physically and chemically, causing quality degradation of the material, and technology to only place graphene in a necessary local part of an integrated photonic device is not developed yet.

Meanwhile, photonic devices using graphene include pulse lasers able to output pulses on the order of femtoseconds (ultrafast optical pulse generation devices) and ultrafast optical switches able to switch at the speed of GHz or above.

The pulse laser refers to laser that can obtain pulse-shaped output, compared to continuous wave (CW) laser. In particular, the development of ultrashort pulse laser has a wide range of application such as large capacity optical signal processing, ultra-high speed sensing, microprocessing, and non-destructive testing.

To generate pulses with a short pulse width and a high repetition rate in pulse lasers, mode-locking technique is applied. The mode-locking technique is largely divided into active mode-locking and passive mode-locking methods, and the active mode-locking method includes forced mode-locking that modulates at the same frequency as an external modulation signal using a modulator placed in laser, and self-mode-locking that spontaneously arises due to nonlinearity of a laser medium. In the passive mode-locking method, it is general to use a saturable absorber (SA).

In the passive mode-locking method, one of the typical methods is a CPML method which generates ultrashort pulses based on an optical amplifier and a saturable absorber during coherent interaction in the saturable absorber between two pulses propagating in opposite directions.

The saturable absorber used in the passive mode-locking method plays a role in matching start points of many modes to each other, and when the phase of the modes are matched with respect to this point, a pulse laser generates ultrashort pulses. With the development of technology using semiconductors and nanomaterials, the passive mode-locking method is recently receiving much attention due to its advantages such as small size, outstanding optical nonlinearity, and economic efficiency.

Meanwhile, semiconductor saturable absorber mirror (SESAM) has a problem that a complex semiconductor process having a low economic efficiency is used, and it is thermally weak and has low compatibility with optical fibers. Thus, attempts have been made to introduce a new nanomaterial, for example, carbon nanomaterial, to the development of pulse lasers, in order to increase a pulse generation effect and integration.

Due to high optical nonlinearity of graphene, ultrafast optical switching is possible. In general, optical switches are a device in which an independent optical channel serves as a pump and affects another channel to change the properties of the channel, i.e., the optical properties such as wavelength, intensity and polarization. Switches using optical nonlinearity of a material are characterized by very fast operation, and in the case of graphene, can perform the operation of GHz or above, distinguishably from simple thermal switches. In the optical switch, with pump being a channel running in the same direction as another channel (modulated channel) on which a particular signal is carried, two additional channels are generated at a predetermined interval near the two channels on the spectrum, and this phenomenon is called four-wave mixing (FWM). The signal channel modulated fast through this FWM phenomenon is copied to the newly generated two additional channels, making it possible for the new channels having different wavelengths to receive the content of a signal. By this operation, the photonic device performing FWM can be used as a wavelength converter.

Optical switches that operate at ultra-high speed also move toward integration, and if they become so smaller that they are compatible with a semiconductor device, an operation of placing graphene in a desired part of the device through transfer will be, in fact, impossible. Accordingly, it is determined that a method for in situ synthesis of graphene on a local surface of a target device in air at normal temperature will induce the great development of a large number of integrated photonic devices to be developed in the future.

To use graphene as a saturable absorber for pulse lasers or ultrafast switches, studies have been made to prepare a suspension containing dispersed graphene oxide and easily coat the suspension on the end of an optical fiber, and a method for transferring graphene grown on a particular substrate to the surface of a target photonic device is used. However, disadvantages are that graphene is not easy to spray or coat on a particular substrate, and graphene may be damaged or deformed during coating, and synthesis and coating of graphene for pulse laser applications is a tedious process.

SUMMARY

In this circumstance, therefore, the present disclosure is directed to providing a method for in situ synthesis of graphene along the lengthwise direction of waveguide.

The present disclosure is further directed to providing a photonic device including graphene obtained using the method.

The present disclosure is further directed to providing a femtosecond laser and an ultrafast optical switching device including graphene obtained using the method.

To achieve the object of the present disclosure, a method for in situ synthesis of graphene along a lengthwise direction of a waveguide applied to a photonic device according to an embodiment includes processing an evanescent field of laser propagating in the waveguide to spread outward the waveguide, depositing a nickel thin film on a surface of the waveguide, growing graphene between the surface of the waveguide and the nickel thin film by irradiating telecommunication laser to a core of the waveguide, and removing the nickel thin film from the waveguide.

In the embodiment of the present disclosure, the method for synthesis of graphene may include, when an optical fiber is the waveguide, polishing cladding of the optical fiber along the lengthwise direction, to induce the evanescent field of the laser outward the optical fiber, to allow for interaction with the nickel thin film.

In the embodiment of the present disclosure, the method for synthesis of graphene may include, when an optical fiber is the waveguide, reducing a thickness of the optical fiber through heating a target part of the optical fiber and pulling two sides to make a tapered optical fiber, to allow for interaction with the nickel thin film.

In the embodiment of the present disclosure, the method for synthesis of graphene may include, when an optical fiber is the optical waveguide, removing cladding of the optical fiber through etching of a target part of the optical fiber to induce the evanescent field of the laser outward the optical fiber, to allow for interaction with the nickel thin film.

In the embodiment of the present disclosure, the method for synthesis of graphene may include, when a planar waveguide is the waveguide, allowing for interaction of the evanescent field with the nickel thin film on a target side surface of the planar waveguide.

In the embodiment of the present disclosure, the growing of graphene may use continuous wave (CW) laser as a heating source.

In the embodiment of the present disclosure, the growing of graphene may include irradiating the telecommunication laser to the optical fiber at the output of −30 dBm to 30 dBm for 1 second to 100 minutes.

In the embodiment of the present disclosure, the growing of graphene may be performed under a general atmospheric environment.

In the embodiment of the present disclosure, the growing of graphene may be performed at temperature of 100° C. or less.

In the embodiment of the present disclosure, the grown graphene may be multilayer graphene of 20 layers or less.

In the embodiment of the present disclosure, the nickel thin film may be 10 to 1000 nm in thickness.

In the embodiment of the present disclosure, the removing of the nickel thin film may use metal etching.

To achieve another object of the present disclosure, a photonic device according to an embodiment includes graphene obtained in situ by the method for in situ synthesis of graphene along a lengthwise direction of a waveguide.

To achieve still another object of the present disclosure, an ultrafast optical pulse generation device according to an embodiment uses, for a saturable absorber, graphene obtained in situ by the method for in situ synthesis of graphene along a lengthwise direction of a waveguide.

In the embodiment of the present disclosure, the ultrafast optical pulse generation device may generate a laser pulse with a pulse width between a few tens of femtoseconds (fs) and a few tens of picoseconds (ps).

In the embodiment of the present disclosure, the ultrafast optical pulse generation device may further comprises laser cavity that includes gain medium, optical isolator to guarantee unidirectional flow of the light, polarization controller (PC) to control polarization state of the laser, coupler to couple the laser output, extra chromatic dispersion component to adjust the overall chromatic value in the laser cavity, and saturable absorber to generate the laser pulses from the continuous wave laser.

To achieve yet another object of the present disclosure, an ultrafast optical switching device according to an embodiment uses optical nonlinearity of graphene obtained in situ by the method for in situ synthesis of graphene along a lengthwise direction of a waveguide.

In the embodiment of the present disclosure, the ultrafast optical switching device may further include at least one component of a first channel and a second channel to generate different continuous wave lasers, a modulator to embed a signal on the laser through modulation, a tunable filter to tune center wavelength with the laser to reduce noise, a directional coupler to couple the lasers, an amplifier to respectively amplify the intensity of the laser, and a polarization controller (PC) to control polarization of the laser.

According to the method for in situ synthesis of graphene along the lengthwise direction of waveguide, by use of laser used for telecommunications, graphene can be synthesized in situ at a desired location in a photonic device, and based on this, an optical nonlinear device can be implemented. Specifically, when an optical fiber-based photonic device irradiates a telecommunication laser operating for optical data to a nickel layer coated along the flat side surface through polishing of the side surface of an optical fiber, carbon included as an impurity in the nickel layer is deposited between the optical fiber and the nickel layer to form graphene.

Accordingly, (1) it is possible to fabricate high-quality graphene-based devices without the need for a transfer process, (2) special vacuum environment or high temperature necessary for synthesis, or an external energy source such as an additional laser is not needed, (3) a constituent component of graphene, carbon atom, is not separately supplied from the external and an impurity included in metal is used, (4) it is possible to control the very small shape and location of graphene as desired, and (5) because all the areas other than a very small heating area maintain the room temperature, it can be applied to flexible substrates in the future.

As described above, by presenting a method for in situ synthesis of graphene on only a target part of a photonic device without transfer, the present disclosure prevents graphene from invading an unwanted surface of the photonic device in using optical nonlinearity of graphene, and customizes graphene at a very small part that is impossible to place graphene through transfer.

In particular, by this technology, graphene is synthesized on the side surface of an optical waveguide, and thus nonlinear photonic devices can be implemented by placing graphene in situ on the side surface of integrated photonic devices. This is different from the conventional method which obstructs the propagation of laser and places nano-devices on the propagation path, and offers a very advantageous opportunity in terms of design and process.

The graphene synthesized in situ has optical nonlinearity allowing very fast operation, and thus can be used to develop ultrafast photonic devices.

DETAILED DESCRIPTION

Figure 1A:
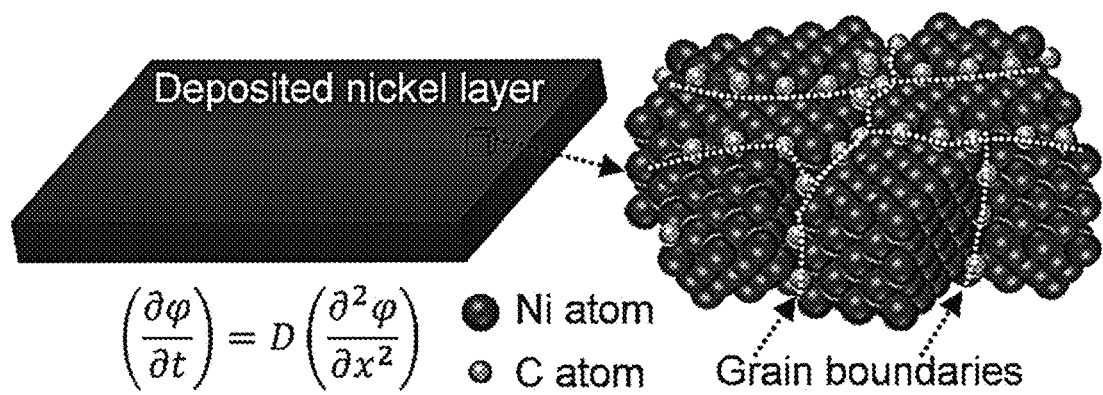
FIG. 1A is a diagram showing polycrystalline nickel (Ni) deposition on a flat surface of a waveguide.

The present disclosure is described in detail as below with reference to the accompanying drawings in which particular embodiments for carrying out the present disclosure are shown for illustration. These embodiments are described in sufficient detail to enable those skilled in the art to practice the present disclosure. It should be understood that various embodiments of the present disclosure are different from each other, but they do not need to be exclusive. For example, a particular shape, structure and characteristic described herein, in connection with one embodiment, may be implemented in other embodiments without departing from the spirit and scope of the present disclosure. It should be further understood that modification may be made to the position or arrangement of respective elements in each disclosed embodiment without departing from the spirit and scope of the present disclosure. Therefore, the following detailed description is not intended to make in a limitative sense, and the scope of the present disclosure is only defined by the appended claims, if appropriately described, along with the full scope of equivalents to which the claims are entitled. In the drawings, similar reference numerals denote same or similar functions throughout many aspects.

Hereinafter, the preferred embodiments of the present disclosure will be described in more detail with reference to the accompanying drawings.

Figure 1B:
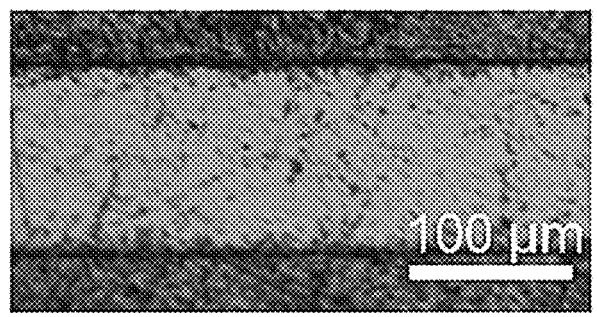
FIG. 1B is an optical image of the waveguide.

FIG. 1A is a diagram showing polycrystalline nickel (Ni) deposition on the flat surface of a waveguide, and FIG. 1B is an optical image of the waveguide.

The present disclosure synthesizes graphene in situ at a desired position in a photonic device by employing laser used for telecommunications, and based on this, implements an optical nonlinear device.

Specifically, polishing is performed on an optical fiber along the lengthwise direction of waveguide in an optical fiber-based photonic device to form a flat surface. The optical fiber has a core formed at the center through which a laser passes, and cladding surrounding the core and formed of a material having a higher refractive index than the core.

The side surface of the cladding is polished along the lengthwise direction of the optical fiber to remove parts. Accordingly, when viewed from the side surface of the cladding, a D-shaped groove is formed, and a flat surface is formed. A nickel (Ni) layer is coated on the flat surface of the optical fiber, and when the nickel (Ni) layer coated on the flat surface is irradiated with a telecommunication laser operating for optical data, carbon included as an impurity in the nickel (Ni) layer is deposited between the optical fiber and the nickel layer to form graphene.

Referring to FIG. 1A, a polycrystalline nickel (Ni) thin film is deposited on the flat surface of the D-shaped optical fiber using electron beam evaporation.

In an embodiment, nickel (Ni) pellets are added to a graphite crucible during the deposition process, carbon (C) atoms attached to the surface of nickel (Ni) as an impurity are evaporated, and a polycrystalline nickel (Ni) layer, in which the carbon (C) atoms are concentrated, is deposited on the D-shaped optical fiber.

Referring to FIG. 1B, shown is an optical image of the nickel (Ni)-deposited D-shaped optical fiber. The nickel (Ni) thin film may be formed as a polycrystalline film with a thickness of 1 to 1000 nm, for example, 100 nm, using 99.999% nickel (Ni) by electron beam deposition.

A sample is put in an evaporation chamber, and to increase the mean free path of nickel (Ni) atoms in the chamber and reduce the number of existing impurities, the pressure is reduced to $1.6 \times 10^{-6}$ Torr. Initially, 10 nm nickel (Ni) layer is deposited at the rate of 0.2-0.3 Å/s, and the remaining 90 nm is deposited at the rate of 2-3 Å/s. The internal chamber temperature reached ~40° C. during evaporation due to the heat of the electron beam. However, the temperature is low temperature that is not harmful to the optical fiber.

To spread out an evanescent field of laser propagating into the optical fiber core, the effective refractive index around the core should be reduced, and to this end, when parts of the clad whose the refractive index is defined as about 1.4572 are polished and replaced with an air layer having the refractive index of 1, the target evanescent field is spread out, and interaction with a material disposed in the field is enhanced.

This method for inducing the evanescent field outward includes a method for producing a D-shaped fiber as well as heating and pulling a target part of an optical fiber to form a waist part having a sharp reduction in diameter, and this is called a tapered optical fiber, and this tapered optical fiber also allows graphene to be produced through deposition of a nickel layer around the thinned waist and interaction with laser evanescent field.

Another additional method is an etched optical fiber. This optical fiber also removes a clad part with hydrofluoric (HF) acid to reduce the effective refractive index of a target part and induces the evanescent field outward to allow it to interact with the nickel layer deposited around it.

In optical waveguides, in addition to optical fibers, a planar waveguide is the most essential waveguide in configuring an optical integrated circuit. This waveguide is manufactured by a semiconductor process, and when laser propagates in the waveguide, a uniquely possessed evanescent field spreads outward the waveguide, and graphene is synthesized in situ at a target part of the planar waveguide by the interaction between the evanescent field and the locally deposited nickel layer.

The D-shaped optical fiber is produced by polishing the cladding of single-mode fiber (SMF). The minimum insertion loss and polarization dependent loss of the prepared D-shaped optical fiber are each measured as ~6 dB and 2 dB. First, 99.999% polycrystalline nickel (Ni) of about 100 nm is deposited on the polished surface of the D-shaped optical fiber using electron beam deposition. During the deposition process, carbon (C) atoms as an impurity on the surface of the nickel (Ni) source are evaporated together with nickel (Ni) to form a carbon (C)-containing nickel (Ni) layer.

Figure 2A:
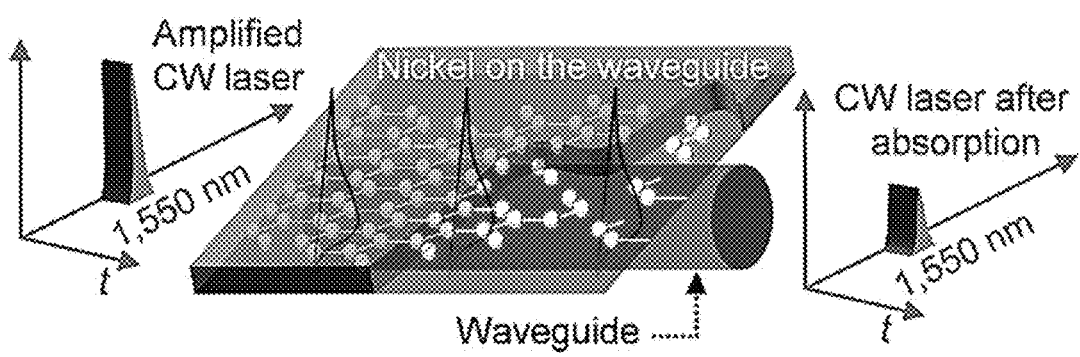
FIG. 2A is a diagram showing in situ laser induced synthesis of graphene on a flat surface of a waveguide.

Referring to FIG. 2A, shown is a laser irradiation process used to synthesize graphene according to an embodiment of the present disclosure. The amplified C-band continuous wave (CW) laser acts as a heating source for graphene growth, and is coupled to one end of the D-shaped optical fiber. In an embodiment, the optical fiber may be irradiated with a telecommunication laser at the output of −30 dBm to 30 dBm for 1 second to 100 minutes.

For example, a continuous wave laser of distributed feedback (DFB) laser diode (LD) that operates at 1552 nm and is amplified by high output erbium doped fiber amplifier (EDFA) uses an optical circulator, and laser radiation is incident on the nickel (Ni)-deposited D-shaped optical fiber through port 2 of the circulator.

Because the D-shaped optical fiber has high polarization sensitivity, low nickel (Ni) layer interaction at the interface greatly relies on the state of polarization of incident light. At the start of laser irradiation at the interface, the polarization direction of incident laser is set (by manipulating a polarization controller) to the state in which the minimum output exists at the other end of the fiber to maximize the light-nickel (Ni) layer interaction.

The evanescent field of the amplified CW laser increases the temperature at the nickel (Ni)/optical fiber boundary, and carbon (C) atoms start to diffuse in the nickel (Ni) layer. While incident laser power is 20 dBm (100 mw), an average minimum output power set by the polarization controller is 0 dBm (1 mw). Accordingly, incident power at the boundary for graphene growth is estimated to be 19.96 dBm (99 mw).

The D-shaped optical fiber is very sensitive to the state of polarization (SOP) of incident light, and the SOP of incident laser may be controlled by the polarization controller (PC) to guarantee the material interaction with maximum light at the interface by setting to the minimum output at the output.

Because the D-shaped optical fiber is asymmetric in the cross section after polishing to remove parts of the cladding, the y polarized light component (together with many other components having different SOPs) cannot propagate through the optical fiber, but scatters through the flat surface of the D-shaped optical fiber and interacts with the deposited nickel (Ni).

In this way, incident laser increases the temperature at the nickel (Ni)/optical fiber boundary, nearby carbon (C) atoms in nickel (Ni) start to diffuse through nickel (Ni) and precipitate toward the nickel (Ni)/optical fiber boundary, to form graphene.

The cladding of the optical fiber may be polished along the lengthwise direction, to induce the evanescent field of telecommunication laser outward the optical fiber to allow for the interaction with the nickel thin film. In an embodiment, making a tapered optical fiber with a few micrometers (μm) thickness by heating a target part of the optical fiber and pulling two sides to reduce the thickness of the optical fiber, and making an etched optical fiber by removing a clad of a target part of the optical fiber through etching with hydrofluoric (HF) acid to reduce the thickness of the optical fiber may be further performed. Furthermore, making an essential planar optical waveguide for an integrated photonic device may be further performed.

Generally, the net diffusion of atoms is determined by the interdiffusion coefficient of the composite material system. The carbon (C) atoms of the nickel (Ni) matrix show a high net diffusion rate enough to reach the nickel (Ni)/optical fiber boundary under laser irradiation. According to the Fick's second law, when only the concentration distribution of each element is taken into account, diffusion process may be expressed as $(\partial\varphi/\partial t)=D(\partial^2\varphi/\partial x^2)$. Here, each of $D$, $\varphi$, $t$ and $x$ denotes the diffusivity, the concentration of atoms, the time, and the distance.

Carbon diffusion through bulk nickel is the mechanism proposed by the present disclosure to grow multilayer graphene at the nickel (Ni)/optical fiber boundary under laser irradiation. Because the D-shaped optical fiber is produced by hand-operated cladding polishing, the length at the interaction between laser of the polished surface and nickel (Ni) is determined by controlling the length of polished surface.

In this way, large-area graphene synthesis may be accomplished by evanescent field laser irradiation on nickel (Ni) throughout the long length of the polished surface of the optical fiber. Once radiation is removed, the nickel (Ni) layer is rapidly cooled, and carbon (C) atoms are precipitated at the graphene boundary and interface to grow graphene.

After the irradiation step, a sample is soaked in 0.2M iron III chloride ($FeCl_3$) or DI water for 30 minutes to etch the nickel (Ni) layer, leaving graphene formed in situ on the flat surface of the D-shaped optical fiber. Accordingly, multi-layer graphene formed in situ is left on the polished surface of the D-shaped optical fiber.

Figure 2B:
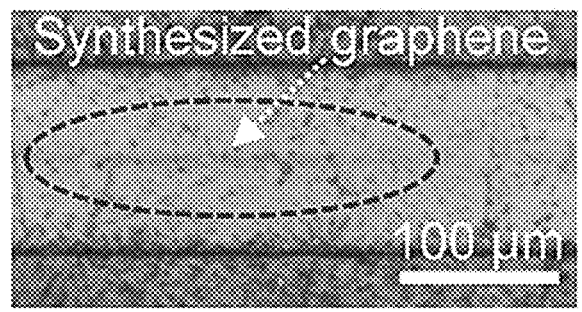
FIG. 2B is an optical image of a waveguide after laser irradiation and nickel (Ni) etching.

FIG. 2B is an optical photographic image of D-type plane after nickel (Ni) etching. The graphene pattern appears on the core surface after synthesis and etching process. The length of graphene formed on the surface is measured to be ~150 μm, and is referred to as interaction length during optical operation. This device can easily obtain four-wave mixing (FWM)-based ultrafast all-optical switching or wavelength conversion.

Figure 3A:
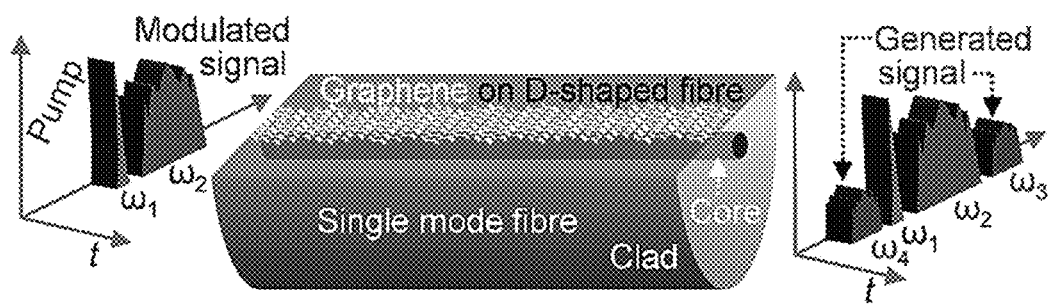
FIG. 3A is a diagram showing a four-wave mixing (FWM) effect using graphene synthesized on a D-shaped optical fiber.

Referring to FIG. 3A, shown is a schematic diagram of FWM having graphene synthesized on the flat surface of the D-shaped optical fiber. Continuous wave pump of $\omega_1$ and data signal probe of $\omega_2$ are coupled and transmitted to a graphene-based nonlinear device with high third-order non-linearity ($\chi^{(3)}$).

This configuration makes use of an evanescent field of a propagation signal using nonlinear properties through interaction with graphene. The evanescent field shows a strong electric field, a long interaction length and low loss transmittance through graphene/waveguide surface providing a high optical damage critical value as well as high third-order nonlinearity.

In the output, an additional new signal is generated at $\omega_3$ and $\omega_4$ by FWM in the graphene-based nonlinear device. Because third-order nonlinearity is an ultrafast process, high nonlinear behavior of graphene on the waveguide surface can identify ultrafast modulation of incident signal, and a signal newly generated by FWM follows immediately after the modulation pattern of incident signal.

Copying of the modulation pattern of incident signal to the newly generated signal is the standard of ultrafast optical switching. Due to energy preservation during FWM, the wavelength of the newly generated signal wave may be written as $1/\lambda_{generated\ signal} = 2/\lambda_{pump} - 1/\lambda_{signal}$. Accordingly, the wavelength of the newly generated signal ($\lambda_{generated\ signal}$) can be simply adjusted by adjusting the pump ($\lambda_{pump}$) and signal ($\lambda_{signal}$) wavelength.

Figure 3B:
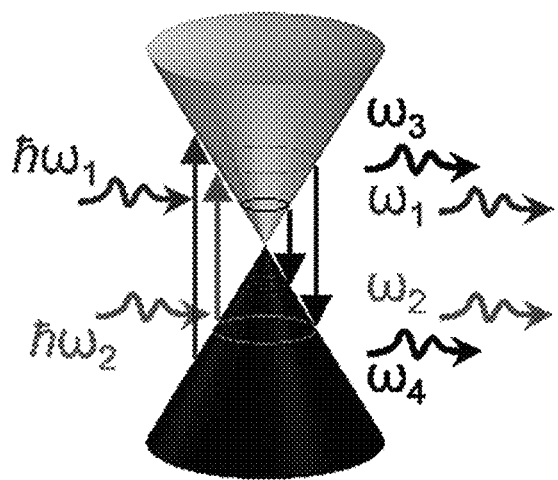
FIG. 3B is a schematic diagram showing that the principle of FWM is related to the band structure of graphene.

Referring to FIG. 3B, the principle of graphene-induced FWM is illustrated. When pump light of frequency $\omega_1$ and signal light of frequency $\omega_2$ are simultaneously incident on graphene crystal, electronic transition of graphene structure occurs due to photon absorption and emission, and new frequencies $\omega_3 = 2\omega_1 - \omega_2$ and $\omega_4 = 2\omega_2 - \omega_1$ are generated.

Hereinafter, the properties of graphene synthesized according to the present disclosure are described. The graphene film grown on the flat surface of the D-shaped optical fiber may be analyzed using Raman spectroscopy, X-ray photoelectron spectroscopy (XPS), energy dispersive X-ray spectroscopy (EDS) and transmission electron microscopy (TEM).

Figure 4A:
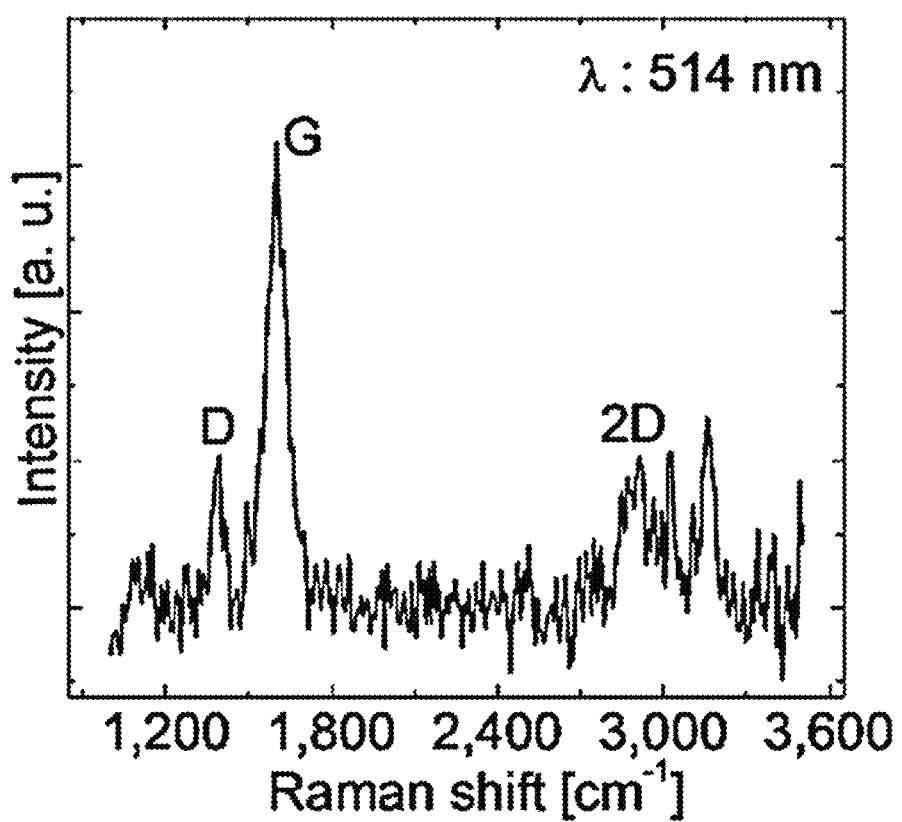
FIGS. 4A to 4F are graphs and images showing the properties of graphene synthesized according to the present disclosure.

Referring to FIG. 4A, shown is Raman spectrum obtained on the D-shaped optical fiber surface after graphene synthesis followed by nickel (Ni) etching. This spectrum shows D peak at ~1340 cm$^{-1}$, G peak at ~1600 cm$^{-1}$ and 2D peak at ~2840 cm$^{-1}$, and these are all predicted peak positions of graphene. The G band of the Raman spectrum appearing at 1594 cm$^{-1}$ originates from the doubly degenerate zone-centered $E_{2g}$ phonon mode associated with in-plane bond stretching motion of sp$^2$ hybridized carbon (C) atom pairs.

$I_D/I_G$ peak intensity ratio refers to the degree of crystallization of the film and is measured to be ~0.32, and graphene shows good quality almost free from defects. The defect of graphene may be caused by symmetry breakage of graphene basal plane. Because the flat surface of the optical fiber is prepared by hand-operated cladding polishing of single mode fiber (SMF), a rough surface appears on the flat surface of the D-shaped optical fiber of SMF.

The surface roughness may cause symmetry breaking deformation to grown graphene. The symmetry breakage of the graphene basal plane may happen in uniaxial deformation or doping. Both may happen in this task. Furthermore, during the synthesis process, unintended nickel (Ni) doping may occur on the graphene basal plane, causing a defect in the graphene film.

Figure 4B:
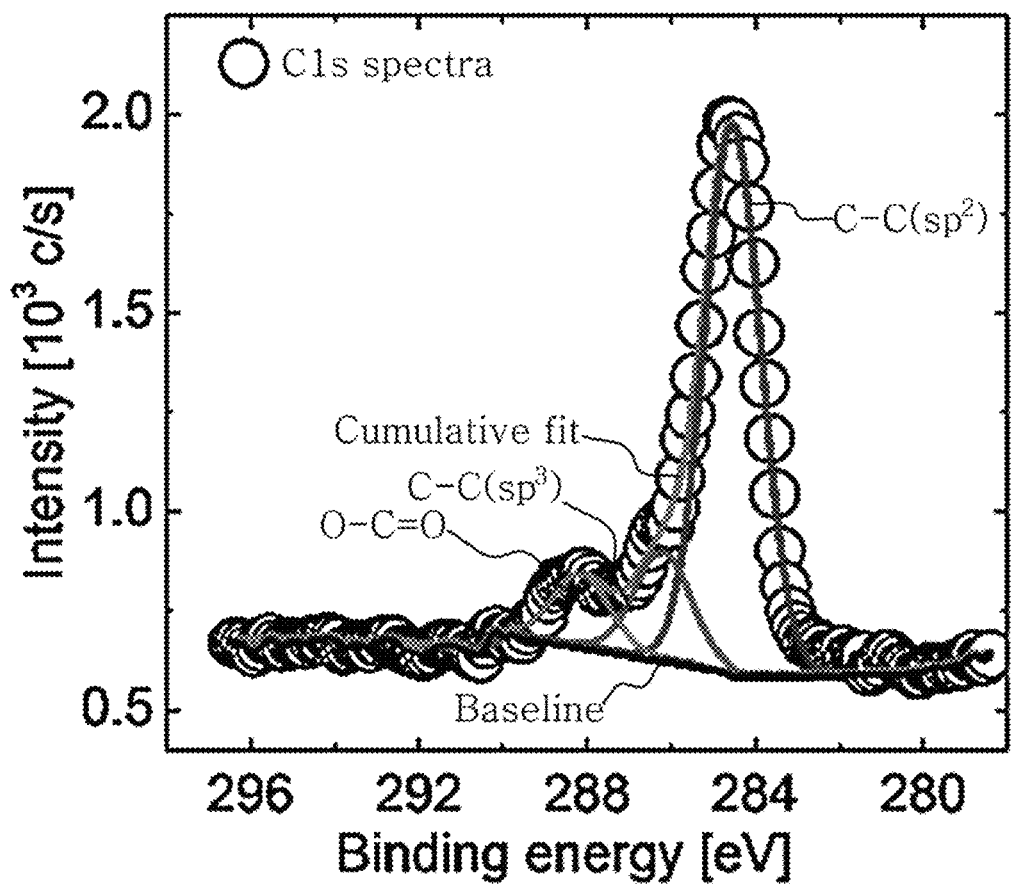

The analysis of detailed structure and composition of the graphene film is conducted using XPS as shown in FIG. 4B. The C1s spectrum of FIG. 4B shows a single peak having maximum intensity in the binding energy of sp$^2$ hybridized carbon (C) atoms (284.53 eV). The deconvolution of peak areas shows that 74% of carbon (C) atoms is aromatic (sp$^2$ hybridization), 14.44% is associated with sp$^3$ hybridization, the binding energy is 286.3 eV, and the remaining 11.47% is associated with C=O having the binding energy of 288.3 eV.

Figure 4C:
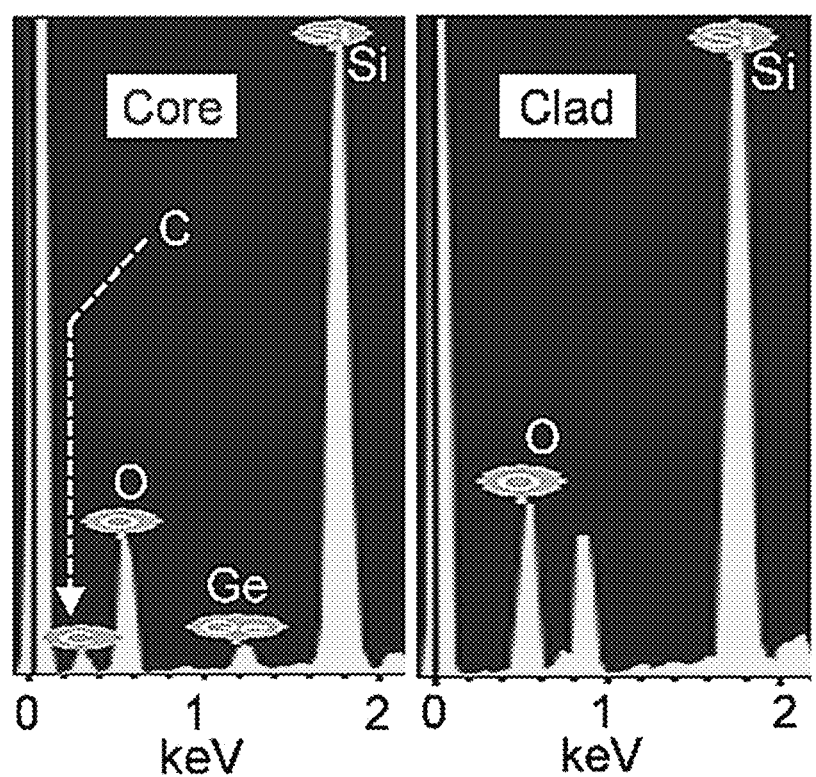

As can be seen from FIG. 4C, comparative analysis of chemical elements may be conducted for each of the core and the cladding using EDS. The EDS analysis of the core shows that germanium (Ge) and carbon (C) all exist, and because the optical fiber core is doped with germanium (Ge), germanium (Ge)-doped core supports graphene formation.

By comparison, the EDS analysis of the cladding only shows the presence of silicon (Si) and oxygen ($O_2$), and implies that graphene is not formed on the cladding. The EDS results obtained from the sample of the present disclosure are similar to EDS results of graphene grown by CVD.

Figure 4D:
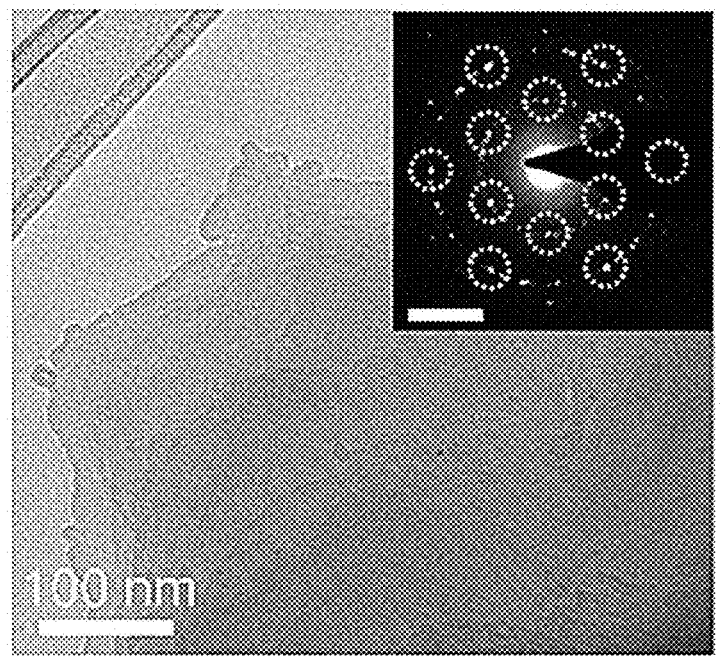

TEM analysis is conducted on synthesized graphene which is transferred from the D-shaped optical fiber surface to a holey carbon (C) film on copper (Cu) grid by hand-operation. FIG. 4D shows a TEM image of multilayer graphene on copper (Cu) grid identifying 2-dimensional graphene form.

The hexagonal crystal structure of grown graphene corresponding to the selected area electron diffraction (SAED) pattern is shown in the inner drawing. In this pattern, two bright rings correspond to graphene crystal plane. The distance between planes of carbon (C) atoms arranged in graphene lattice fringes measured in the SAED rings corresponds to 0.218 nm (corresponding to graphene crystal plane (0110)) and 0.123 nm graphene crystal plane (1210).

Figure 4E:
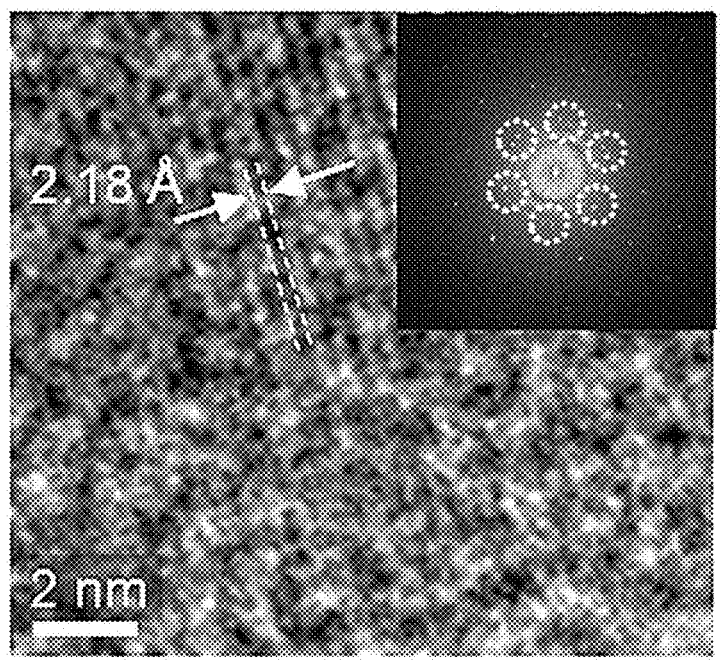

FIG. 4E is a HRTEM image showing lattice fringes having the distance between planes measured at 0.218 nm corresponding to graphene crystal. The inner drawing in FIG. 4E illustrates fast Fourier transform (FFT) showing hexagonal symmetry of lattice fringes on the image. Multiple sets of hexagonal patterns come from multilayer graphene.

Figure 4F:
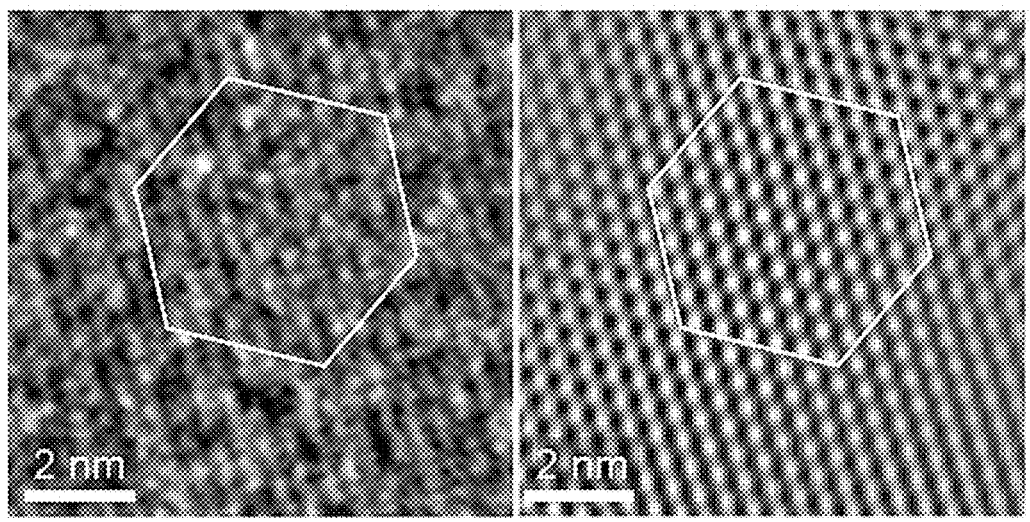

FIG. 4F is a HRTEM image showing lattice fringes (left) of graphene showing hexagonal lattice of carbon (C) atoms on 2-dimensional graphene crystal plane and its corresponding filtered image (right).

The SAED pattern and FFT pattern show many sets arranged hexagonally that make up a given ring in the pattern. This is caused by the distorted order of directions of multilayer graphene due to tearing, folding and destruction occurring while graphene is imperfectly transferred to TEM grid. The grown graphene on the D-shaped optical fiber is applied to FWM-based ultrafast optical switching. Fast modulation of an input signal is transmitted as a signal converted by FWM using the other CW pump in the graphene/D-shaped optical fiber.

Hereinafter, an embodiment is described in which graphene synthesized according to the present disclosure is applied to FWM-based ultrafast optical switching. The present disclosure uses graphene as a nonlinear photonic device in FWM, and can be applied to a broadband optical spectrum using the action of an evanescent field of graphene.

FWM is a phenomenon arising due to the Optical Kerr Effect, and occurs when two or more high power optical signals of different wavelengths propagate through an optical medium. In recent quantum and photon studies, FWM is used for wavelength conversion, optical parametric amplification, supercontinuum generation, frequency comb generation, and various signal manipulation.

Figure 5:
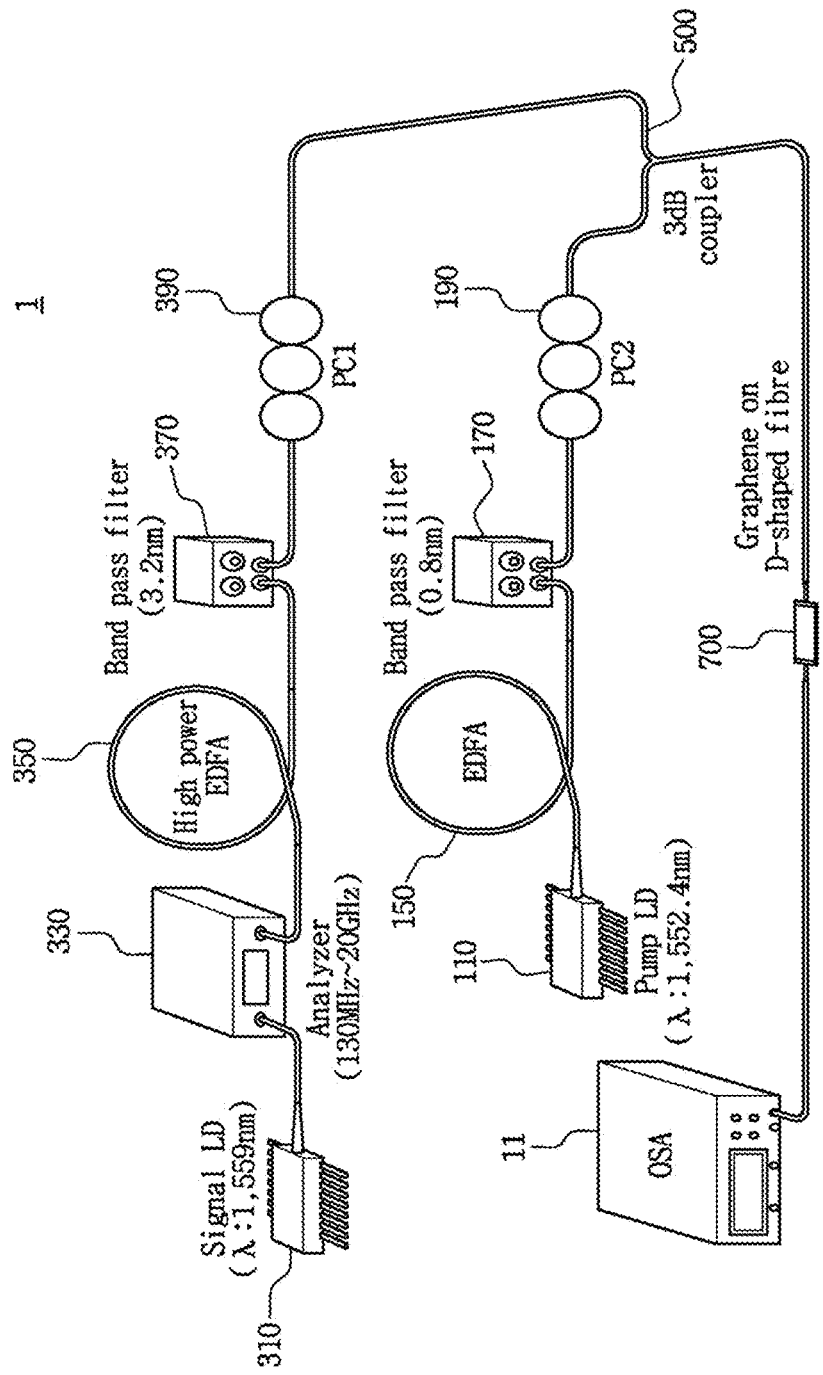
FIG. 5 is a configuration diagram of an ultrafast optical switching device based on graphene synthesized in situ according to an embodiment of the present disclosure.

FIG. 5 is a configuration diagram of an ultrafast optical switching device for FWM-based wavelength conversion using graphene grown on the flat surface of the D-shaped optical fiber. The elements of the optical switching device are connected with the optical fiber, and the structure of the ultrafast optical switching device shown in FIG. 5 is for illustration only, and may be modified by the omission and addition of elements if necessary.

Referring to FIG. 5, the ultrafast optical switching device 1 according to this embodiment includes a first channel 110, a second channel 310, a modulator 330, a first wavelength tunable filter 170, a second wavelength tunable filter 370, a directional coupler 500, and a photonic device 700 using graphene.

Each of the first channel 110 and the second channel 310 generates continuous wave lasers of different wavelengths. That is, the first channel 110 outputs a continuous wave first laser of first wavelength, and the second channel 310 outputs a continuous wave second laser of second wavelength that is different from the first wavelength.

For example, the first channel 110 and the second channel 310 are a continuous wave laser of distributed feedback laser source operating at 1552.4 nm and a CW tunable laser operating at 1560 nm, and each plays pump and signal roles for FWM.

The modulator 330 modulates the second laser outputted from the second channel 310. In an embodiment, the modulator 330 modulates the continuous wave second laser to a pump signal by periodic switching ON/OFF. The signal is modulated to 20 GHz, guaranteeing a very fast nonlinear response of grown graphene.

The optical switching device 1 may further include a first amplifier 150 to amplify the wavelength of the first laser outputted from the first channel 110, and a second amplifier 350 to amplify the wavelength of the second laser outputted from the second channel 310 or the modulator 330. For example, the pump is amplified by a normal erbium doped fiber amplifier (EDFA), while the modulated signal light is amplified by a low noise high output erbium doped fiber amplifier (HP-EDFA).

The first wavelength tunable filter 170 is a frequency filter that changes the wavelength of the first laser. Furthermore, the second wavelength tunable filter 370 is a frequency filter that changes the wavelength of the modulated second laser. As wavelength tuning is possible by using the first wavelength tunable filter 170 and the second wavelength tunable filter 370, control for a desired frequency band may be taken by making use of this.

For example, the amplified signals are all filtered to block an unnecessary amplified spontaneous emission (ASE) mode. The state of polarization of light is controlled by two separated polarization controllers (PCs) before coupling to graphene/D-shaped optical fiber sample through 3 dB coupler. The pump power injected into the graphene sample is estimated to be ~19 dBm, and the signal power is set to be relatively low.

The optical switching device 1 may further include a first polarization controller 190 and a second polarization controller 390 to control polarization of the first laser and the second laser. The directional coupler 500 couples and outputs the first laser and the second laser.

The photonic device 700 controls the coupled first laser and second laser outputted from the directional coupler 500 using nonlinearity of graphene and the action of the evanescent field. As described in FIG. 3A, in the photonic device 700, graphene is synthesized on the flat surface of the D-shaped optical fiber.

Figure 6A:
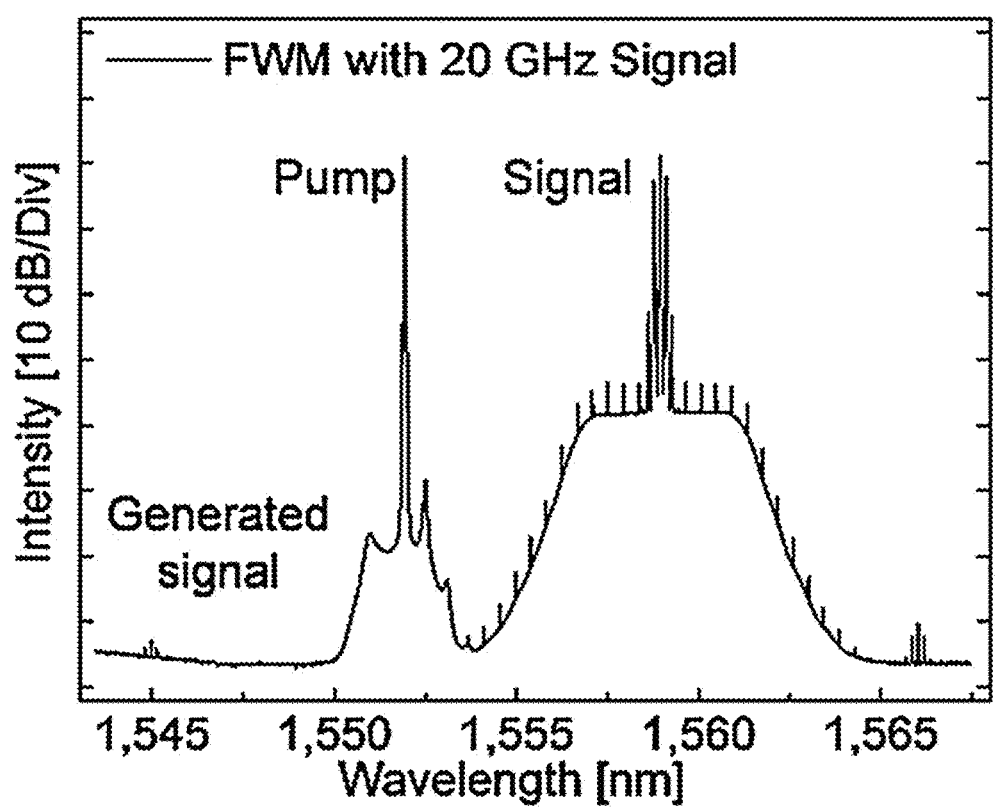
FIGS. 6A to 6D show spectrum results of signals modulated in the ultrafast optical switching device of FIG. 5.

FIG. 6A shows an output FWM spectrum obtained from an optical spectrum analyzer (OSA) of the graphene/D-shaped optical fiber device. In the spectrum, incident pump and signal light generate a new signal of different wavelengths through FWM of graphene. Because of high polarization sensitivity, the graphene/D-shaped optical fiber obtains FWM from the graphene device by controlling the state of polarization (SOP) of both pump and signal and setting to a particular SOP.

The intensity of the evanescent field of two inputs interacting with graphene on the optical fiber is responsible for FWM. Because the interaction length is ~150 μm obtained during the graphene synthesis process of the D-shaped optical fiber, the evanescent field having the particular SOP of the two inputs has greater interaction with graphene.

Accordingly, the improved third-order nonlinearity of graphene generates a new signal through FWM. The modulation speed of signal light is adjusted to a maximum of 20 GHz to distinguish whether FWM-based wavelength conversion originates from the thermal effect of graphene crystal or fast third-order nonlinearity. The thermal effect induced by the enhanced evanescent field may accomplish wavelength conversion due to changes in material properties as a function of temperature, but this effect cannot respond to fast modulation of an input signal.

In contrast, because the nonlinear effect is an ultrafast process, the third-order nonlinear effect of graphene responds to 20 GHz signal, and generates a new signal having the same modulation frequency. The converted signal appears as two generated signals at 1556 nm and 1545 nm according to the FWM standards. The conversion efficiency (CE) defined as a ratio of generated signal power vs incident original signal power is measured to be −71.8 dB.

Figure 6B:
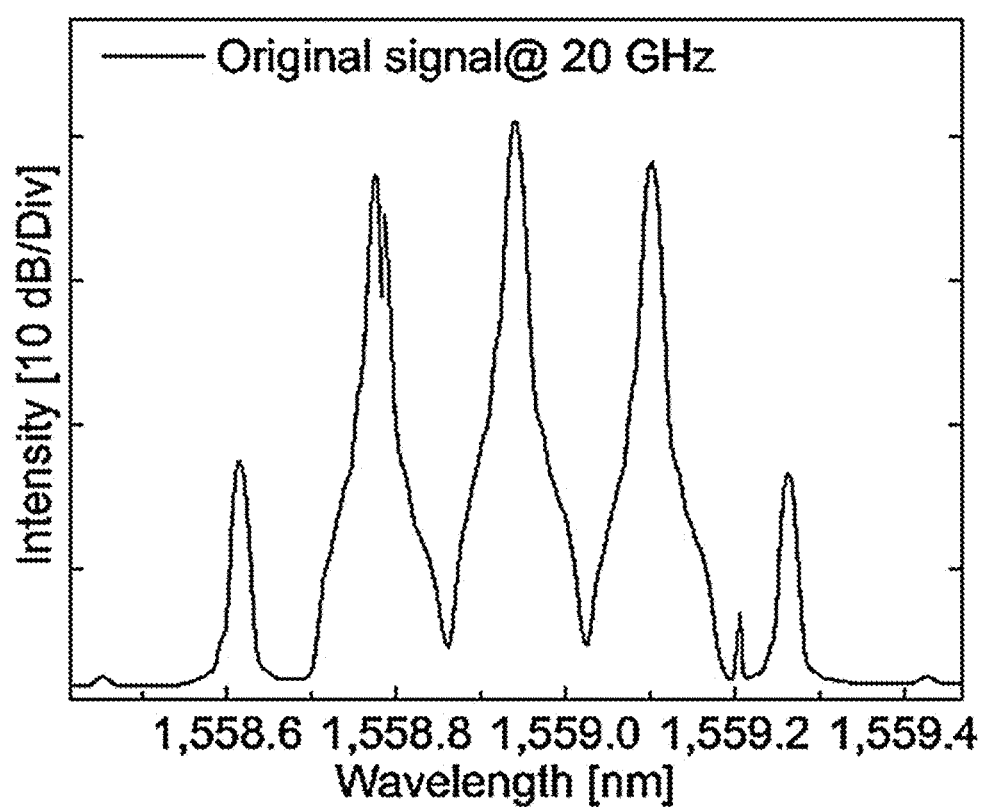
Figure 6C:
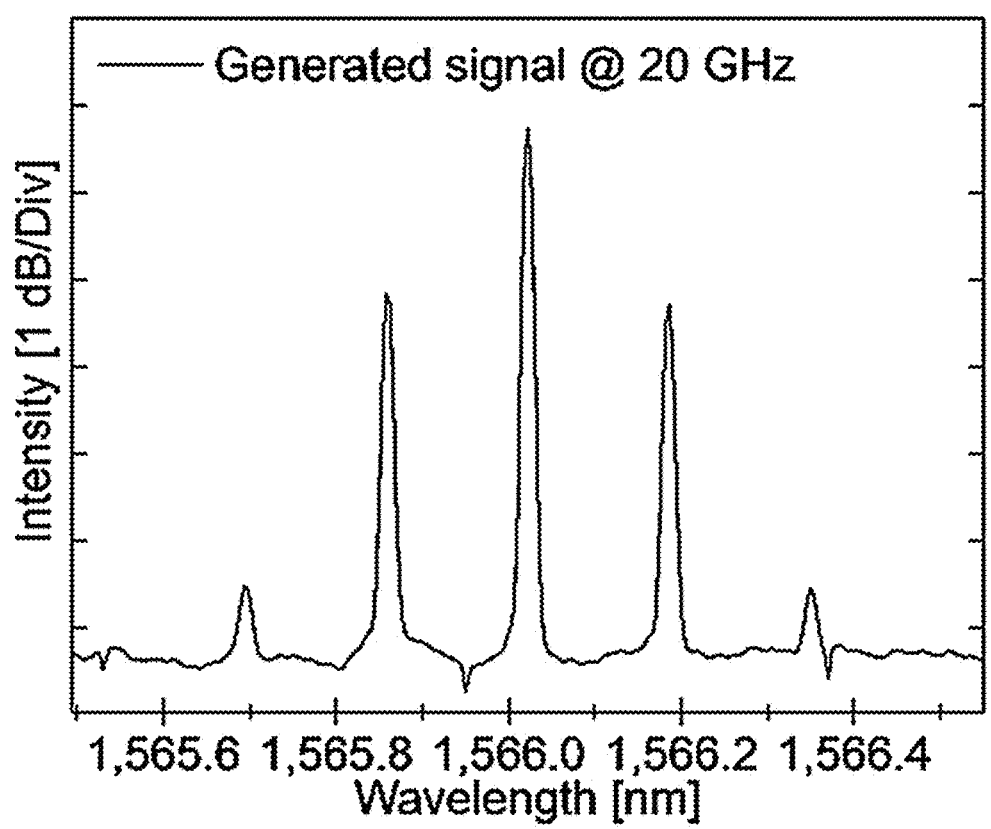

FIGS. 6B and 6C show approximation of original signal with the modulation frequency of 20 GHz and it corresponding generated signal. The signal generated at ~1566 nm exactly leads to the modulation format of the original signal of ~1558.9 nm. The distance between the generated sideband and the basic peak of the converted signal is the same as the original signal. This verifies that FWM-based wavelength conversion resulting from third-order optical nonlinearity of graphene necessary for fast optical signal processing is graphene.

To compare the effects, the same experiment is carried out on the exposed D-shaped optical fiber (before graphene synthesis). This is because of intrinsic nonlinearity of silica fiber although might be caused by wavelength conversion with the exposed fiber. However, an extinction ratio (ER) of the generated signal is lower than that of the D-shaped fiber with grown graphene. The two samples are all examined in a variety of modulation frequency ranges up to 20 GHz.

Figure 6D:
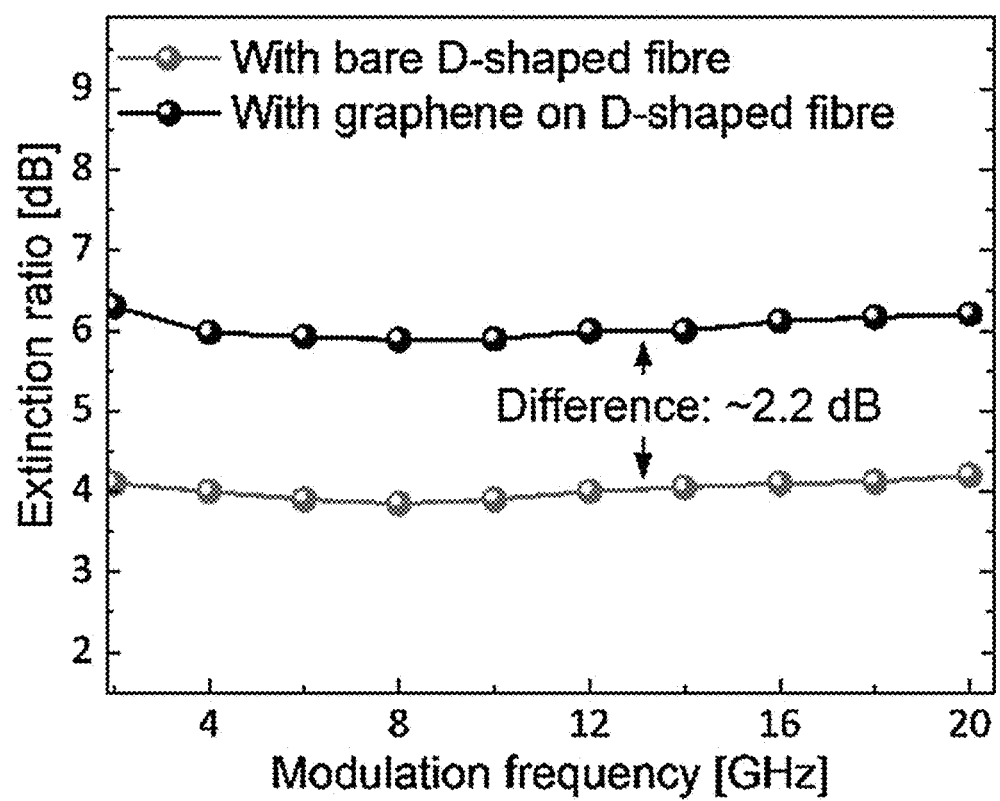

FIG. 6D shows a comparison of the extinction ratio of the signal generated from the exposed D-shaped optical fiber and the extinction ratio of the D-shaped optical fiber having synthesized graphene. The extinction ratio of the D-shaped optical fiber having synthesized graphene is greater by 2.2 dB than that of the exposed D-shaped optical fiber under the same experiment condition.

The signal generated without graphene is lower by 66% than the signal with grown graphene. This represents that 66% of nonlinearity necessary for FWM comes from the grown graphene.

Figure 7A:
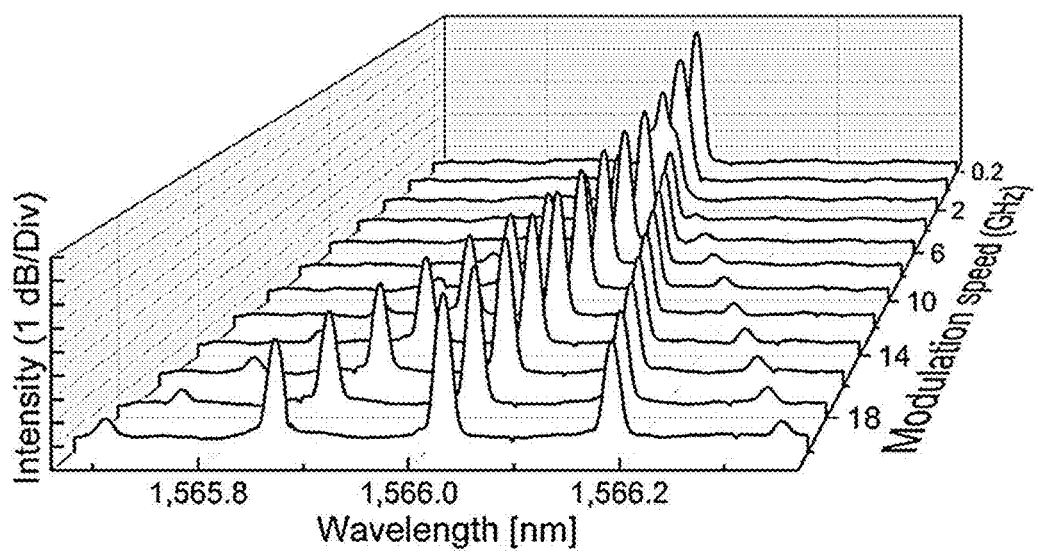
FIGS. 7A and 7B are graphs showing the properties of signals generated in FIG. 5.

FIG. 7A shows a graph of a signal generated at ~1566 nm by FWM of CW pump and a signal having different modulation frequency ranges of 200 MHz to 20 GHz. The modulation pattern of the converted signal gradually changes within the applied modulation frequency range like the original signal. The sideband moves further from the basic peak of the generated signal with the increasing modulation speed, and also appears in the original signal of 1558.9 nm within the same frequency range.

Figure 7B:
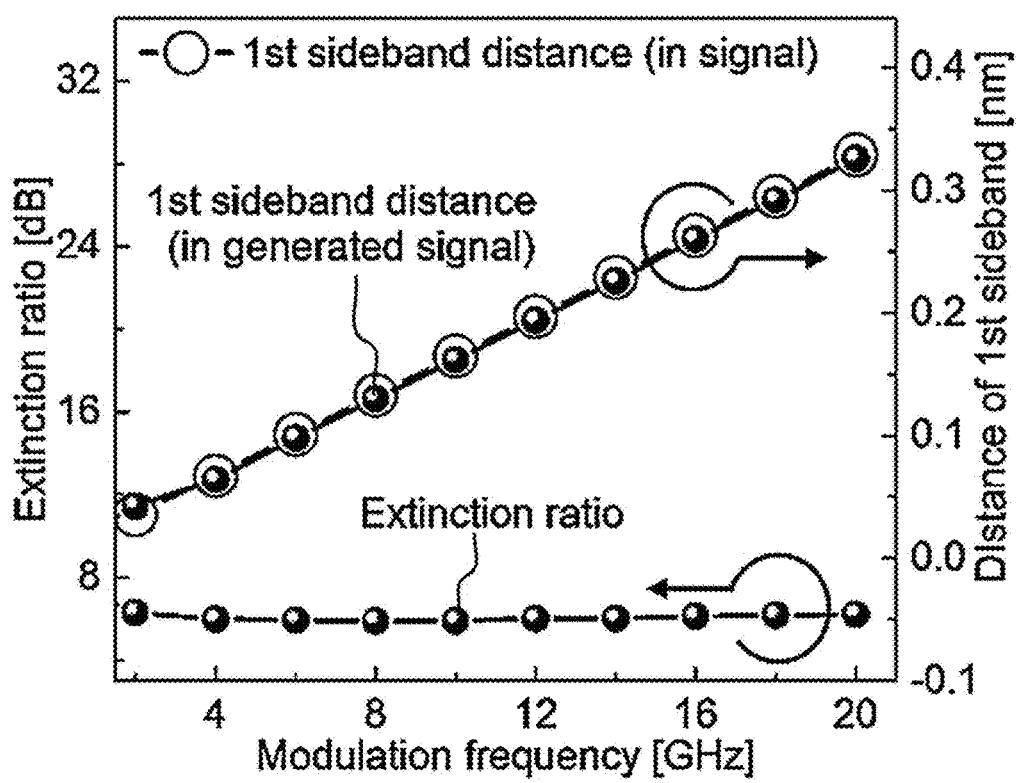

FIG. 7B is a plot of ER and separation of the first sideband of the generated signal as a function of original signal and modulation signal. The ER of the generated signal is stable in the high modulation frequency range of ~7 dB or more. The separation of first sideband linearly increases based on the modulation frequency, and this is the same as the original signal as shown in the graph.

Parameters such as effective area, refractive index and operating wavelength play an important role in high-order nonlinearity of optical devices. Accordingly, the nonlinear coefficient of the waveguide may be defined as the following Equation 1.

$$\gamma = \frac{2\pi n_2}{\lambda A_{eff(graphene)}}$$ [Equation 1]

Here, $\gamma$, $n_2$, $\lambda$, $A_{eff(graphene)}$ denote the nonlinear coefficient of graphene, the nonlinear refractive index of graphene, the operating wavelength, and the effective mode area of graphene, respectively. The parameters $\gamma$, $n_2$, $\lambda$ are known from the experiment and earlier studies. NL coefficients $\gamma=10^{10}$, $n_2=10^{-15}$ m$^2$/W are constant for graphene, and the operating wavelength is ~1550 nm. From them, the effective area of graphene may be calculated as $4.05\times10^{-7}$ $\mu m^2$.

If there is no graphene, the silica D-shaped optical fiber is an only nonlinear medium. In this case, $\gamma=1.8$, $n_2=2.5\times10^{-20}$ m$^2$/W, and thus the effective area of the optical fiber affected by nonlinearity is calculated as $5.63\times10^{-5}$ $\mu m^2$. The design of experiment may be described as shown in Equation 2 below.

$$n_{2(Gr+fiber)}\times A_{eff(Gr+fiber)} = [n_{2(Gr)}\times A_{eff(Gr)}] + [n_{2(fiber)}\times A_{eff(fiber)}]$$ [Equation 2]

Typically, for SMF, $A_{eff(fiber)}$ may change within the range of 1 to 100 $\mu m^2$ at the region of 1550 nm. If $A_{eff(fiber)}=1$ $\mu m^2$, this is defined as the following Equation 3.

$$n_{2(Gr+fiber)}\times A_{eff(Gr+fiber)} = 4.05\times10^{-34} + 2.5\times10^{-32} \text{ [m}^4/W]$$ [Equation 3]

If $A_{eff(fiber)}=100$ $\mu m^2$, this is defined as the following Equation 4.

$$n_{2(Gr+fiber)}\times A_{eff(Gr+fiber)} = 4.05\times10^{-34} 2.5\times10^{-30} \text{ [m}^4/W]$$ [Equation 4]

If the effective combination mode area $A_{eff(Gr+fiber)}$ or the approximate effective NL index $n_{2(Gr+fiber)}$ is known, other parameter may be calculated. In the case of the present disclosure, it is more difficult to evaluate $A_{eff(Gr+fiber)}$ than $n_{2(Gr+fiber)}$. It may be assumed that the index is inside the range satisfying both graphene nonlinearity and SMF nonlinearity. Accordingly, the possible range of the combined effective mode area of the graphene NL device of the present disclosure may be discovered.

In the case of graphene, when $n_{2(graphene)}=10^{-15}$ m$^2$/W, and in the case of SMF, $n_{2(fiber)}=2.5\times10^{-20}$ m$^2$/W. Because when the two materials are together, the effective index increases, in the case of the present disclosure, the effective combination index $n_{2(Gr+fiber)}$ increases. However, in this case, the value is cannot be known.

Accordingly, the possible range of $n_{2(Gr+fiber)}$ needs to be estimated. SMF refractive index $n_{2(fiber)}$ is negligible compared to $n_{2(graphene)}$. Thus, $n_{2(Gr+fiber)}\approx10^{-15}$ m$^2$/W. Accordingly, $A_{eff(Gr+fiber)}$ of the two cases are $A_{eff(Gr+fiber)}=2.54\times10^{-17}$ m$^2$ ($A_{eff(fiber)}=1$ $\mu m^2$) and $A_{eff(Gr+fiber)}=2.5\times10^{-15}$ m$^2$ ($A_{eff(fiber)}=100$ $\mu m^2$).

It is important to guarantee multipurpose by introducing a nonlinear device into another optical device. To obtain the FWM effect, simpler settings are desirable. Furthermore, in the settings, identifying the wavelength detuning in the FWM effect is impossible, and it is because the bandwidth of a filter used in the settings is too high. By this reason, to identify the FWM effect, pump and signal channels cannot be placed close to each other.

Figure 8:
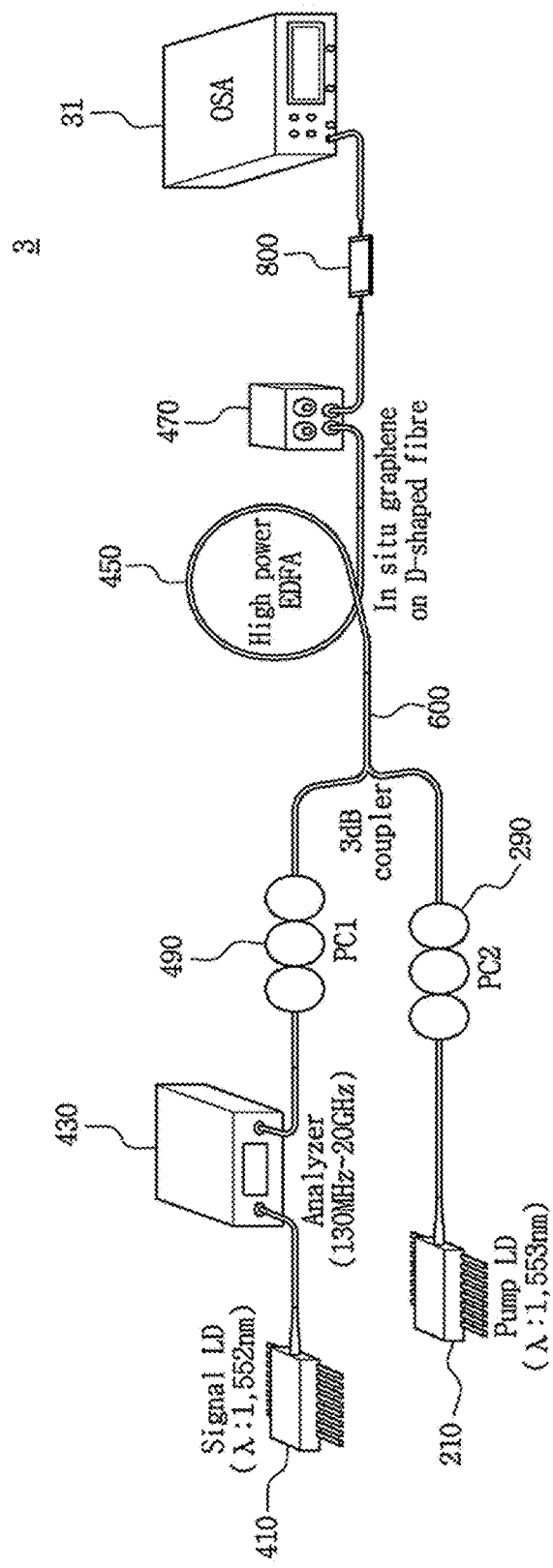
FIG. 8 is a configuration diagram of an ultrafast optical switching device based on graphene synthesized in situ according to another embodiment of the present disclosure.

FIG. 8 shows updated settings for FWM experiment to solve the wavelength detuning problem that may appear in the configuration of the ultrafast optical switching device 1 of FIG. 5. Simpler settings are performed using only one EDFA for both pump and probe signals.

In this way, FWM and wavelength detuning can be demonstrated. Furthermore, it is sufficient to implement with a single filter, reducing the use of additional equipment. In this process, both the pump and the signal pass through 3.2 nm band pass filter at 1552.05 nm and 1553.05 nm. In this embodiment, to perform wavelength conversion on the basis of FWM by modulating the pump or probe signal, the pump channel is modulated.

Specifically, referring to FIG. 8, the ultrafast optical switching device 3 according to this embodiment includes a first channel 210, a second channel 410, a modulator 430, a directional coupler 600, a wavelength tunable filter 470, and a photonic device 800 using phosphorus black.

The elements of the ultrafast optical switching device 3 are connected with an optical fiber, and the structure of the ultrafast optical switching device 3 shown in FIG. 8 is for illustration purposes only, and modification may be made, for example, by the omission or addition of elements if necessary. In this embodiment, a repeated description of the same elements as the ultrafast optical switching device 1 of FIG. 5 is omitted herein.

Each of the first channel 210 and the second channel 410 generates continuous wave lasers of different wavelengths. That is, the first channel 210 outputs a continuous wave first laser of first wavelength, and the second channel 410 outputs a continuous wave second laser of second wavelength that is different from the first wavelength.

The modulator 430 modulates the second laser outputted from the second channel 410. In an embodiment, the modulator 430 modulates the continuous wave second laser to a pump signal by periodic switching ON/OFF.

The optical switching device 3 may further include a first polarization controller 290 and a second polarization controller 490 to control polarization of the first laser and the second laser. The directional coupler 600 couples and outputs the first laser and the second laser.

The optical switching device 3 may further include an amplifier 450 to amplify the wavelength of the coupled first laser and second laser. The wavelength tunable filter 470 is a frequency filter that changes the wavelength of the coupled first laser and second laser. The tuning of signal wavelength is possible by using the wavelength tunable filter 470.

The photonic device 800 controls the coupled first laser and second laser outputted from the wavelength tunable filter 470, using nonlinearity of graphene and the action of an evanescent field.

The photonic device 800 may operate with substantially the same configuration as the photonic device 700 of FIGS. 1 and 3. As described in FIG. 3A, in the photonic device 800, graphene is synthesized and formed on the flat surface of the D-shaped optical fiber.

Figure 9A:
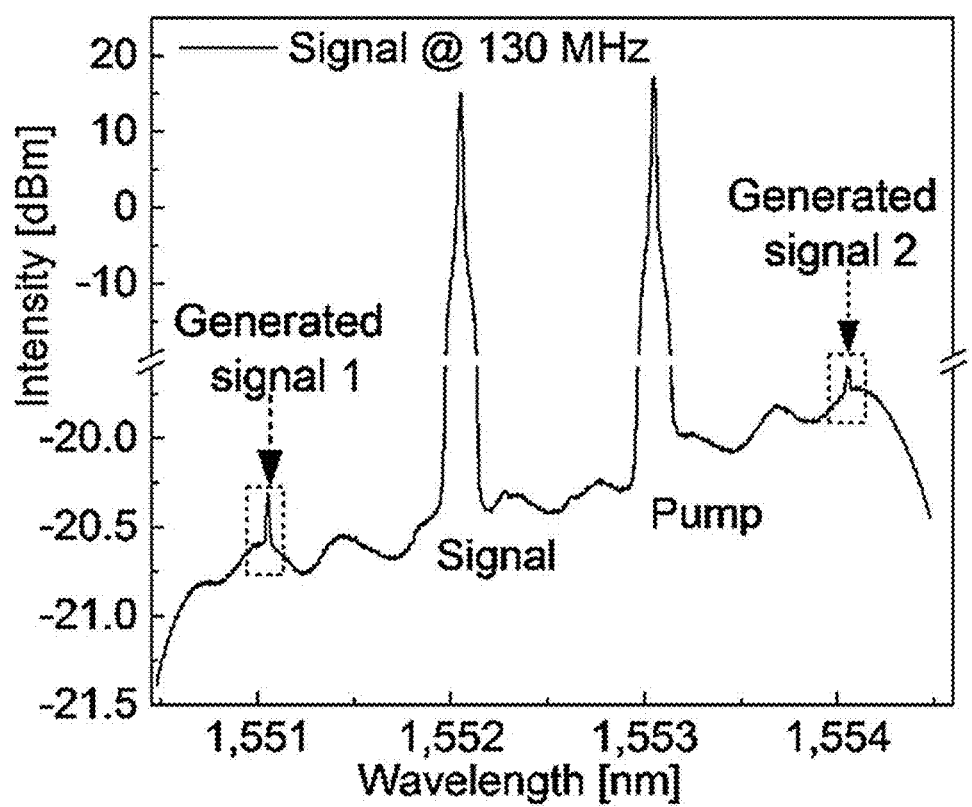
FIGS. 9A to 9C are graphs showing the properties of signals generated in FIG. 8.

FIG. 9A shows wavelength conversion of OSA spectrum of 130 MHz probe signal. A new signal is generated at 1551.05 nm and 1554.05 nm satisfying the standards of FWM process.

Figure 9B:
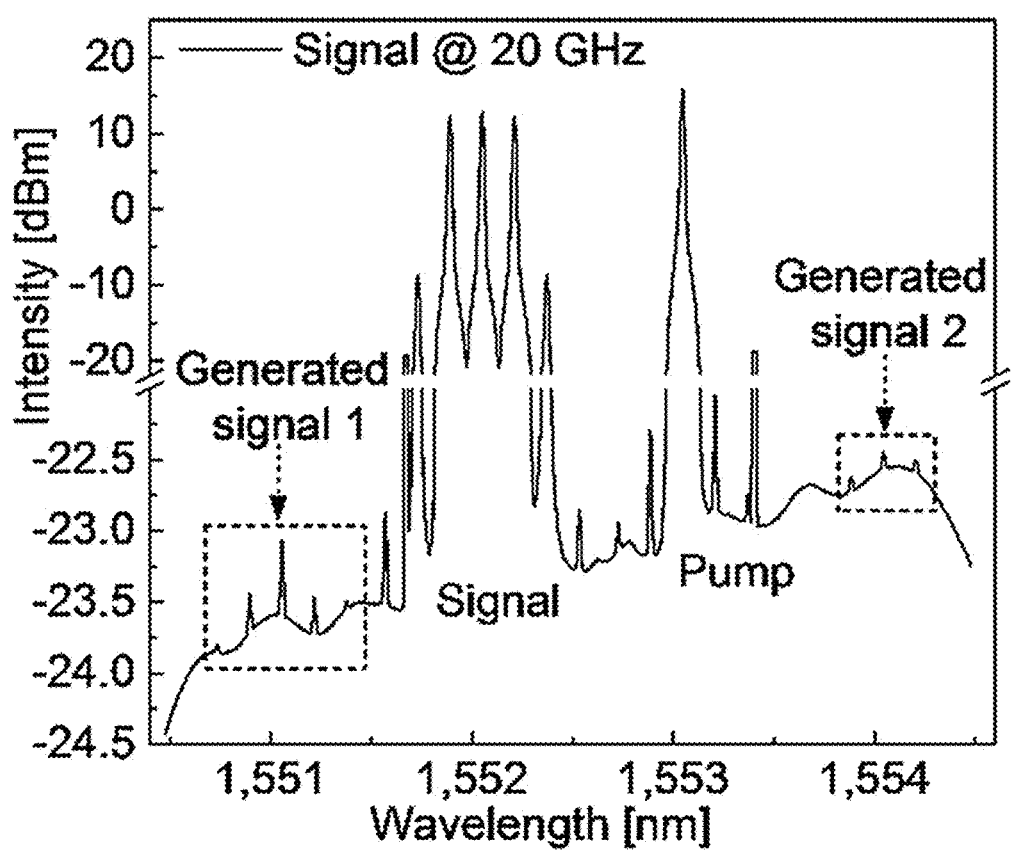
Figure 9C:
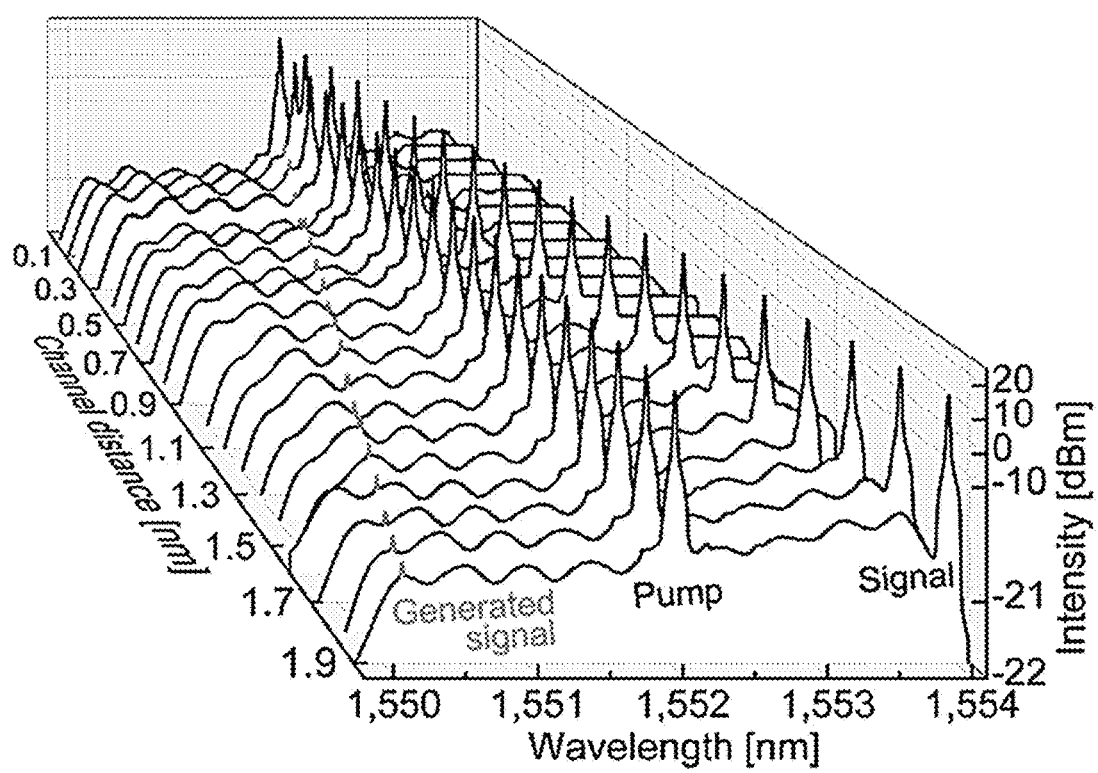

FIG. 9B shows wavelength conversion of OSA spectrum of 20 GHz probe signal. As expected, modulation also can be seen in the generated signal. For these settings, CE and HP-EDFA are all amplified, and they are amplified to −35.391 dB.

The tuning possibility of the generated signal is tuning of the input signal wavelength in the range of about 2 nm, and irradiation is carried out under the experimental settings. In this irradiation, the pump wavelength is fixed to 1552.05 nm, and the signal wavelength is gradually adjusted from 1552.05 nm to 1553.95 nm.

Initially, pump and signal channels are all in the same wavelength, and as shown in FIG. 9A, new signal generation cannot be seen. When the channel distance increases from 0 nm to 1.9 nm at the interval of 0.1 nm as the signal channel is far from the pump channel, a new signal is generated at the same distance from the pump signal. As can be seen from the graph, the generated signal is far from the pump channel as the signal channel is far from the pump signal, and it is another powerful evidence of FWM generation.

In conclusion, first, multilayer graphene is synthesized in situ on flat surface of a D-shaped optical fiber using laser irradiation in ambient conditions. A wide range of characterization technologies prove graphene formation on the fiber. The laser-induced in situ grown graphene shows $sp^2$ binding of high density, and has minimum volume, improving the chip scale integration function of graphene.

Second, FWM-based wavelength conversion of modulation signal is demonstrated using a long interaction length of graphene synthesized in the experiment. The results are compared with the results of a D-shaped optical fiber exposed without graphene. It is found that the power of a signal generated without graphene is lower by 2.2 dB than the power of a signal using graphene.

The tuning possibility of ultrafast switching is guaranteed by the wavelength detuning experiment with considerable conversion efficiency of −35.391 dB. The present disclosure expects that graphene synthesized in situ on the flat surface of D-shaped optical fiber will find additional noticeable applications in optical signal processing more than FWM-based wavelength conversion.

The application of the ultrafast optical switch device based on graphene synthesized according to the above method may include ultrafast optical pulse generation devices using the graphene as a saturable absorber.

The ultrafast optical pulse generation device according to an embodiment can generate laser pulses with the pulse width between a few tens of femtoseconds (fs) and a few tens of picoseconds (ps).

The ultrafast optical pulse generation device according to an embodiment may further include at least one component of a first channel and a second channel to generate different continuous wave lasers, a modulator to carry a signal on the laser through modulation, a tunable filter to tune the center wavelength with the laser to reduce the surrounding noise, a directional coupler to couple the lasers, an amplifier to respectively amplify the intensity of the laser, and a polarization controller (PC) to control polarization of the laser.

While the present disclosure has been hereinabove described with reference to the embodiments, and it will be appreciated by those having ordinary skill in the art that various modifications and changes may be made thereto without departing from the spirit and scope of the present disclosure stated in the appended claims.

The synthesized graphene can be used to convert general continuous wave (CW) laser to femtosecond laser with ultrahigh frequency by use of the property 'saturable absorption' which is high optical nonlinearity of graphene. The implementation of femtosecond laser demonstrates that graphene is really synthesized in a very small region, and the synthesized graphene properly interacts with laser, beyond the simple device application of graphene.

It is expected that the graphene synthesis method developed in this way will bring surprising development to high efficiency of photonic devices handling ultrafast high capacity data in the future, as well as microelectronic devices requiring graphene of complex design, and integrated hybrid devices between them.

What is claimed is:

1. A method for in situ synthesis of graphene along a lengthwise direction of a waveguide applied to a photonic device, the method comprising:
processing an evanescent field of laser propagating in the waveguide to spread outward the waveguide;
depositing a nickel thin film on a surface of the waveguide;
growing graphene between the surface of the waveguide and the nickel thin film by irradiating telecommunication laser to a core of the waveguide; and
removing the nickel thin film from the waveguide,
wherein the method further comprises, when an optical fiber is the waveguide, reducing a thickness of the optical fiber through heating a target part of the optical fiber and pulling two sides to make a tapered optical fiber, to allow for interaction of the evanescent field with the nickel thin film.

2. The method for in situ synthesis of graphene along a lengthwise direction of a waveguide according to claim 1, wherein the method for synthesis of graphene comprises, when an optical fiber is the waveguide, polishing cladding of the optical fiber along the lengthwise direction, to induce the evanescent field of the laser outward the optical fiber, to allow for interaction with the nickel thin film.

3. The method for in situ synthesis of graphene along a lengthwise direction of a waveguide according to claim 1, wherein the method for synthesis of graphene comprises, when an optical fiber is the optical waveguide, removing cladding of the optical fiber through etching of a target part of the optical fiber to induce the evanescent field of the laser outward the optical fiber, to allow for interaction with the nickel thin film.

4. The method for in situ synthesis of graphene along a lengthwise direction of a waveguide according to claim 1, wherein the method for synthesis of graphene comprises, when a planar waveguide is the waveguide, allowing for interaction of the evanescent field with the nickel thin film on a target side surface of the planar waveguide.

5. The method for in situ synthesis of graphene along a lengthwise direction of a waveguide according to claim 1, wherein the growing of graphene uses continuous wave (CW) laser as a heating source.

6. The method for in situ synthesis of graphene along a lengthwise direction of a waveguide according to claim 1, wherein the growing of graphene comprises irradiating the telecommunication laser to the optical fiber at the output of −30 dBm to 30 dBm for 1 second to 100 minutes.

7. The method for in situ synthesis of graphene along a lengthwise direction of a waveguide according to claim 1, wherein the growing of graphene is performed under a general atmospheric environment.

8. The method for in situ synthesis of graphene along a lengthwise direction of a waveguide according to claim 1, wherein the growing of graphene is performed at temperature of 100° C. or less.

9. The method for in situ synthesis of graphene along a lengthwise direction of a waveguide according to claim 1, wherein the grown graphene is multilayer graphene of 20 layers or less.

10. The method for in situ synthesis of graphene along a lengthwise direction of a waveguide according to claim 1, wherein the nickel thin film is 1 to 1000 nm in thickness.

11. The method for in situ synthesis of graphene along a lengthwise direction of a waveguide according to claim 1, wherein the removing of the nickel thin film uses metal etching.

\* \* \* \* \*